United States Patent
Aydelott

[19]

[11] Patent Number: 5,976,245
[45] Date of Patent: Nov. 2, 1999

[54] CZOCHRALSKI CRYSTAL GROWING SYSTEM

[75] Inventor: Richard M. Aydelott, Ridgefield, Wash.

[73] Assignee: SEH America, Inc., Vancouver, Wash.

[21] Appl. No.: 09/096,370

[22] Filed: Jun. 12, 1998

[51] Int. Cl.⁶ ................................................. C30B 15/04
[52] U.S. Cl. ................................ 117/19; 117/30; 117/214
[58] Field of Search ................................. 117/19, 30, 33, 117/214, 218

[56] References Cited

U.S. PATENT DOCUMENTS

| | | | |
|---|---|---|---|
| 4,040,890 | 8/1977 | Burrus, Jr. et al. | 117/19 |
| 5,406,905 | 4/1995 | Yemane-Berhane et al. | |
| 5,700,321 | 12/1997 | Niikura | 117/18 |

FOREIGN PATENT DOCUMENTS 62-153188   7/1987   Japan .

*Primary Examiner*—Robert Kunemund
*Assistant Examiner*—Kin-chan Chen
*Attorney, Agent, or Firm*—Oliff & Berridge PLC

[57] ABSTRACT

A Czochralski crystal growing system includes components for adding dopants to semiconductor materials and for growing single crystals. The components comprise a portion formed of a material that is chemically compatible with the semiconductor material. The portion includes a cavity sized to contain a desired amount of dopant. The cavity protects the dopant from exposure to contaminants, gas flows and heat in crystal growing furnaces. The portion is dipped into a melt to release the dopant. The portion can be a seed crystal which can further be used to grow a single crystal from the melt after doping. The components can include separate first and second portions formed of materials that are chemically compatible with the melt so that the portions can be placed into the melt. At least one of the first and second portions can contain a dopant. The second portion can be a seed crystal for growing a single crystal. The first portion can act as a heat sink to reduce temperature gradients between the melt and the seed crystal, so as to reduce the generation of dislocations in the seed crystal. The Czochralski crystal growing system also provides components for growing single crystals which may optionally not contain a dopant for adding to a melt. These components can comprise a seed crystal and a heat sink that controls heat transfer from the melt to the seed crystal to pre-heat the seed crystal in a controlled manner.

34 Claims, 6 Drawing Sheets

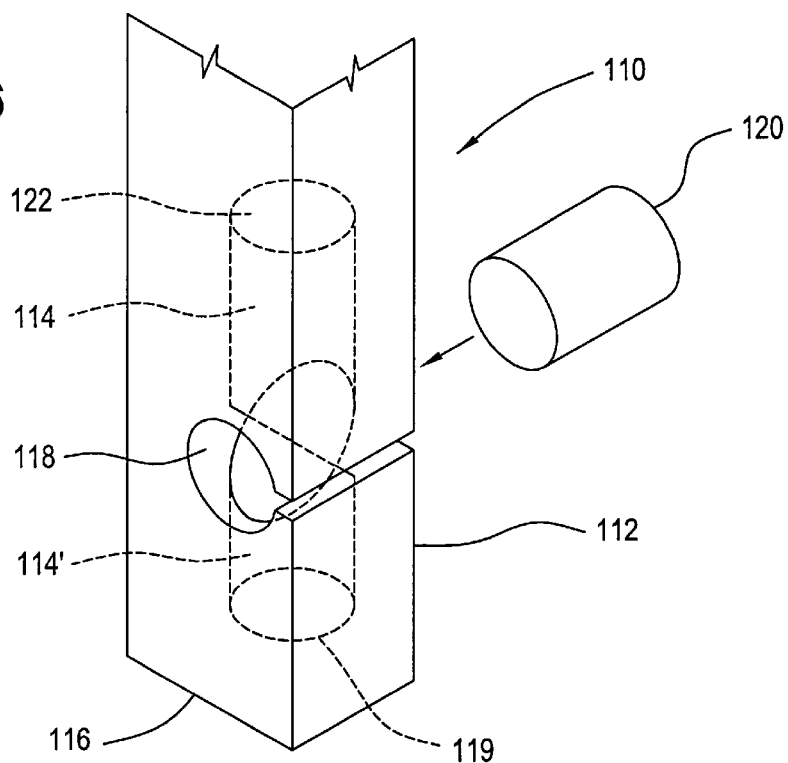
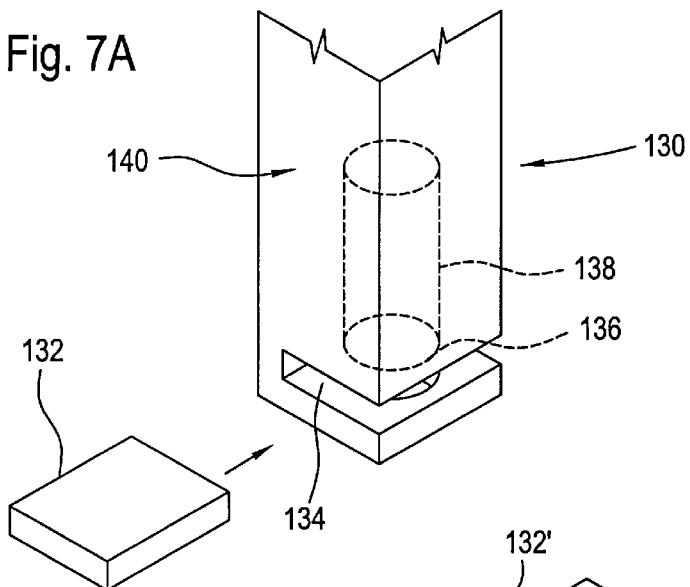
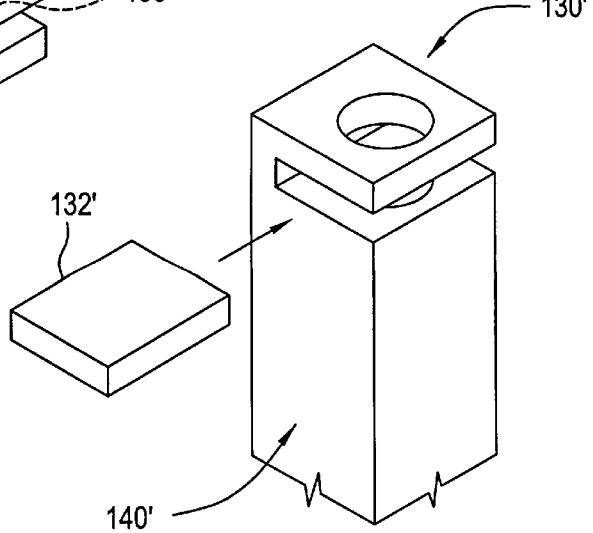

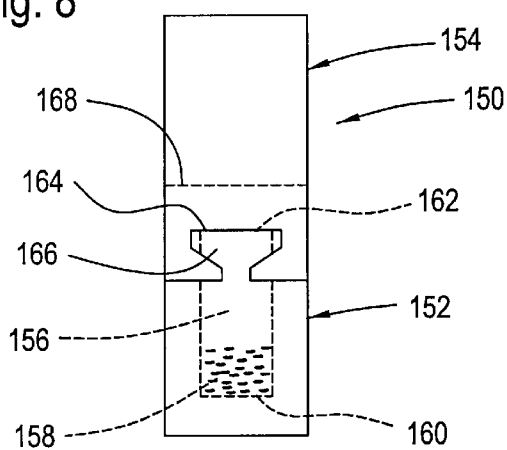
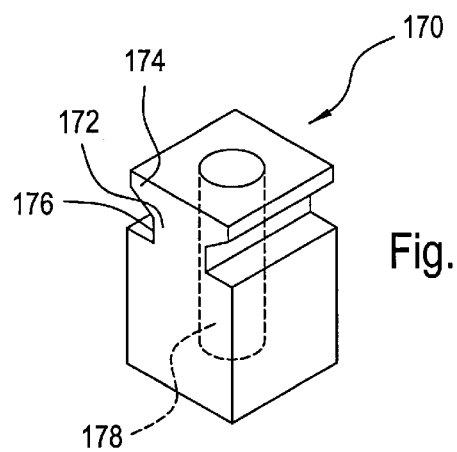
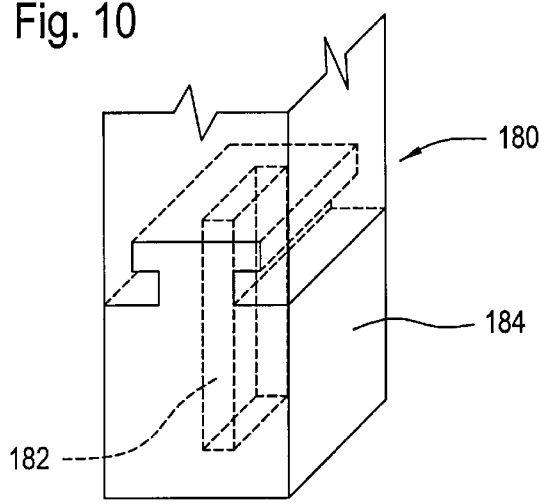
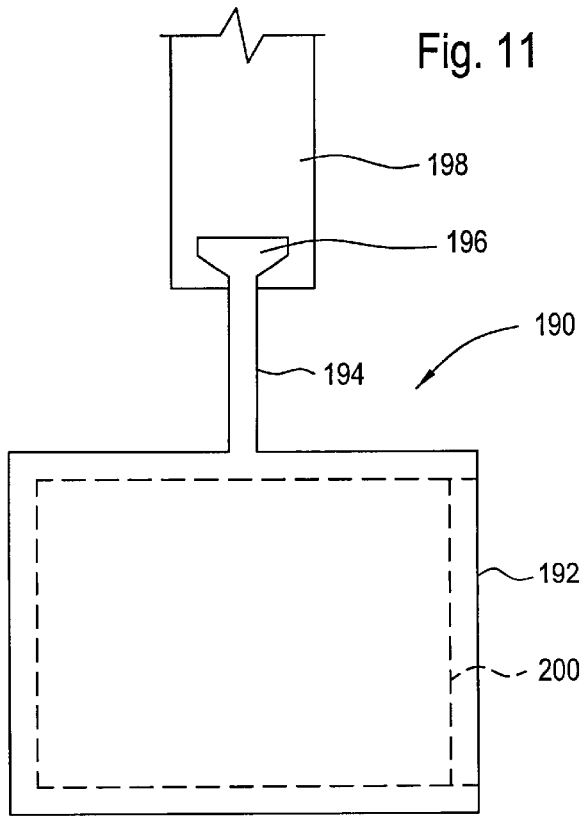

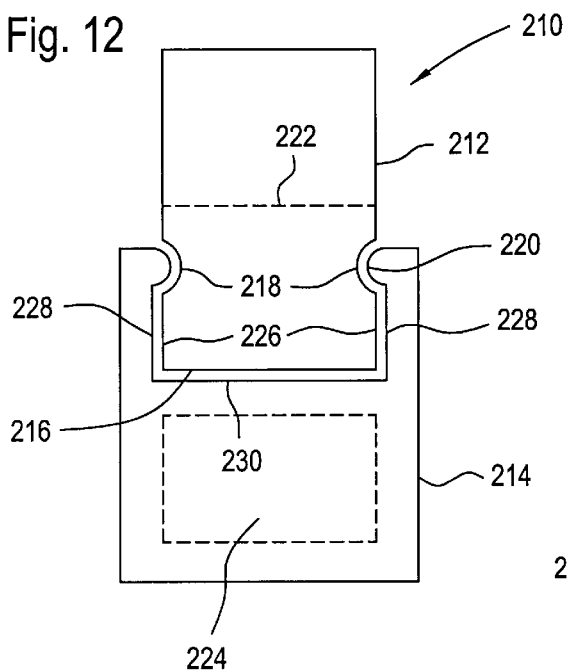
Fig. 12
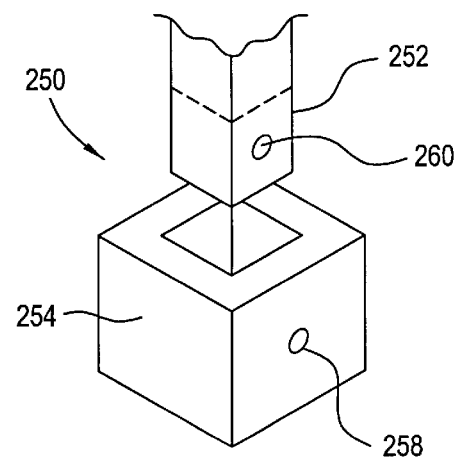
Fig. 14A
Fig. 14B
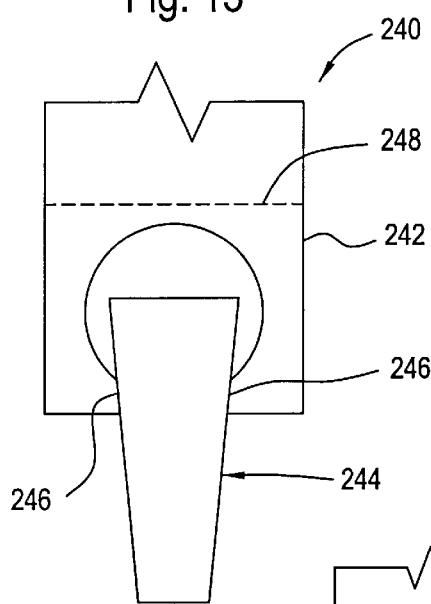
Fig. 13
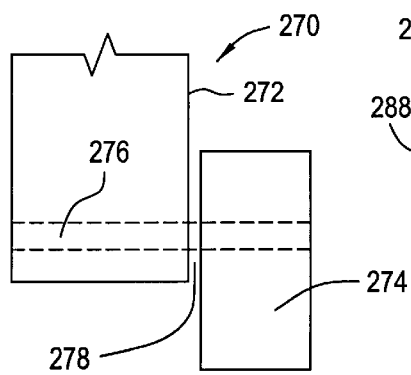
Fig. 15
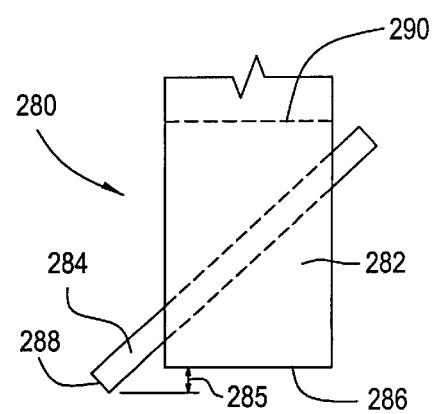
Fig. 16

CZOCHRALSKI CRYSTAL GROWING SYSTEM

BACKGROUND OF THE INVENTION

1. Field of Invention

This invention is directed to the field of growing bulk semiconductor crystals from melts. More particularly, this invention is directed to a Czochralski crystal growing system for growing single crystals of semiconductor materials and also to methods of adding dopants to semiconductor materials and growing single crystals using the crystal growing system.

2. Description of Related Art

The Czochralski crystal growing method is commonly used to grow bulk semiconductor single crystals from melts of semiconductor materials contained in crucibles of crystal growing furnaces. In this method, a seed crystal is brought into contact with the melt and then slowly withdrawn to grow a single crystal.

Extrinsic semiconductor wafers include a controlled amount of dopant material to produce desired electrical properties. An effective amount of dopant to achieve desired electrical properties can be added to a cold charge of polycrystalline semiconductor material, typically stored in a sealed environment in a clean room. It is necessary to break the seal in order to add dopant to the cold charge. Breaking the seal can potentially expose the semiconductor material to contamination.

After the dopant is added to the cold charge, these materials are melted in a crucible in a crystal growing furnace to form a molten mixture. As stated, a seed crystal is used to pull a single crystal ingot from the molten mixture. During melting, dopants having a high vapor pressure such as antimony tend to evaporate from the melt and cause the dopant concentration in the melt to change. As a result, the concentration of such dopants in the ingots can fall outside of the specified range to produce single crystals having desired electrical properties.

It is also known to add dopants to melts of semiconductor materials at the crucible. The dopants are typically granules or flakes. The melt is maintained in an inert gas atmosphere to avoid contamination. During doping of the melt, this gas flow can cause the dopant to be scattered in the furnace near to the crucible. Consequently, a portion of the specified amount of the charge is not added to the melt. The scattered dopant can deposit on protuberances in the furnace. If the amount of dopant that is actually added into the melt is below the specified amount, the dopant concentration in the melt cannot achieve the desired electrical properties in single crystals grown from the melt. In addition, dopants that deposit near the crucible can fall into subsequent melts in the crucible and cause such melts to have dopant concentrations above the specified level. These dopants can also introduce contaminants into the melt. Furthermore, this method requires the pull chamber of the crystal growing furnace to be opened and evacuated several times, which can allow contamination of the melt. Thus, this method occasionally is unable to add desired amounts of dopants to melts. Uncontrolled fluctuations in the dopant concentration in the melt can result in grown single crystals that are unsuitable for use in electronic devices that require precise dopant levels. Such single crystals typically must be scrapped, which represents a significant expense to manufacturers.

It is further known to attach solid dopants directly to seed crystals and to lower the seed and dopant into the melt so as to melt the dopant, as disclosed, for example, in U.S. Pat. No. 5,406,905 and Japanese patent application J 62-153188. Although this method overcomes the problem of scattering of the dopant by gas flows within the furnace, the dopant may drop prematurely into the melt, causing premature doping and also splashing of the melt. Premature doping is especially important for dopants having a high vapor pressure, which need to be added to the melt at the appropriate time to reduce evaporation. In addition, the dopant is not prevented from being exposed to contamination during handling outside of clean environments.

Another important concern during single crystal growing by the Czochralski method is reducing the generation of dislocations when the seed crystal is dipped into the melt. Dislocations are generated at the interface between the seed crystal and the single crystal due to thermal shock caused by the large temperature differential between the seed crystal and relatively much hotter melt. Known methods deliberately form a narrow neck portion in the single crystal just below the seed crystal, so that dislocations in the seed crystal will not propagate into the bulk of the single crystal. This approach does not, however, satisfactorily reduce the generation of dislocations nucleated in the single crystal by thermal strains.

Thus, there is a need for an improved Czochralski crystal growing system that overcomes the above-described disadvantages of known delivery systems. More particularly, there is a need for a Czochralski crystal growing system that can prevent the contamination of dopants prior to being added to melts, protect dopants from heat and gas flows in crystal growing furnaces, and can be used to consistently add specified amounts of dopants directly into melts. There is also a need for a Czochralski crystal growing system that can reduce the generation of dislocations in single crystals due to thermal strains.

SUMMARY OF THE INVENTION

This invention provides Czochralski crystal growing systems that satisfy the above needs. More particularly, embodiments of the Czochralski crystal growing systems can prevent the contamination of dopants outside of clean environments before the dopants are added to melts of semiconductor materials contained in crucibles in crystal growing furnaces. Embodiments of the crystal growing systems also protect dopants from exposure to heat and gas flows in the crystal growing furnaces and prevents dopants from being scattered within the furnaces while being added into melts. In addition, embodiment of the crystal growing systems enable the consistent addition of specified amounts of dopants directly into melts. Embodiments of the crystal growing systems can also be used to add dopants into solid charges of semiconductor materials in clean environments.

Embodiments of the Czochralski crystal growing systems of this invention can also eliminate premature doping and splashing of melts. Embodiments of the crystal growing systems can also reduce the generation of dislocation in single crystals growing from melts, and produce single crystals of improved quality, whether or not dopants are added.

This invention also provides a method of adding desired (effective) amounts of dopants to achieve desired electrical properties directly to melts and to solid charges of semiconductor materials.

In addition, this invention provides a method of growing single crystals having reduced dislocation densities.

Embodiments of a dopant delivery component of the Czochralski crystal growing system can be used to add dopants to solid and molten semiconductor materials. A dopant delivery component can comprise a body portion including an outer surface and a cavity. The cavity has at least one open end at the outer surface. The cavity can contain a desired amount of dopant entirely inside of the body portion. The cavity can protect dopants from exposure to contaminants, gas flows and heat in crystal growing furnaces.

Dopants can be added directly to melts of semiconductor materials contained in crucibles in crystal growing furnaces. Alternately, dopants can be added to cold charges of semiconductor materials stored in clean environments prior to being melted in such crystal growing furnaces.

The body portion can be composed of a material that is chemically compatible with, including the same as, the semiconductor material to which the dopant delivery system is added.

In order to further ensure that the dopants remain contained in the cavity, prevent exposure of the dopants to contaminants and gas flows prior to delivery into the melt, reduce exposure of the dopants to heat and prevent premature doping, the dopant delivery component can further comprise a closure for closing the open end of the cavity.

According to another aspect of this invention, the body portion can be a seed crystal of the semiconductor material to which the dopant is added. Accordingly, the dopant delivery component can be used both to deliver dopants directly to melts, and in growing single crystals from the doped melts.

According to embodiments of this invention, the dopant delivery component can comprise body and lower portions. The lower portion can include a cavity for containing dopant in a protected environment.

In a single crystal growing component of the Czochralski crystal growing system according to aspects of this invention, the body portion can be used both as a carrier for the lower portion and also as a seed crystal for growing a single crystal from molten semiconductor material.

The lower portion can act as a heat sink to reduce temperature gradients between the melt and the body portion when the lower portion is dipped into the melt. When the body portion is a seed crystal, heat transfer from the melt preheats the seed crystal before it is dipped into the melt. This preheating can reduce the generation of dislocations in the seed crystal, resulting in single crystals of increased quality.

According to aspects of this invention, the single crystal growing component can comprise a seed crystal, and a lower portion which acts as a heat sink. The lower portion may optionally also contain dopant.

Thus, Czochralski single crystal growing systems of this invention can prevent the contamination of dopants prior to being added into melts. In addition, this invention can protect dopants from exposure to gas flows and heat in crystal growing furnaces. As a result, the scattering of dopants during addition into melts can be prevented, and the desired amount of dopants can consistently be added directly to the melts. In addition, this invention can reduce thermal strains in seed crystals and single crystals during single crystal growth and thus reduce the generation of dislocations in single crystals due to such thermal strains. This invention can thus produce single crystals having increased quality.

BRIEF DESCRIPTION OF THE DRAWINGS

Preferred embodiments of this invention will be described in detail, with reference to the following figures, in which:

FIG. 6 is a perspective view a dopant delivery component including a cylindrical-shaped closure for closing open ends of two vertical cavity portions according to another embodiment of this invention;

FIG. 7A is a perspective view a dopant delivery component including a plate-shaped closure for closing the open end of a vertical cavity near the bottom end of a body portion according to another embodiment of this invention;

FIG. 7B is a perspective view a dopant delivery component similar to FIG. 7A in which the open end of the vertical cavity is near the top end of a body portion;

FIG. 8 illustrates a dopant delivery component including separate body and lower portions according to another embodiment of this invention;

FIG. 9 illustrates a lower portion of the dopant delivery component of FIG. 8;

FIG. 10 is a perspective view of a dopant delivery component including separate body and lower portions according to another embodiment of this invention;

FIG. 11 is a perspective view of a dopant delivery component including a separate lower portion having a neck region and a body portion according to another embodiment of this invention;

FIG. 12 illustrates a single crystal growing component according to an embodiment of the Czochralski crystal growing system of this invention in which the lower portion includes a void;

FIG. 13 illustrates a single crystal growing component according to another embodiment of this invention;

FIG. 14A is a perspective view of a single crystal growing component according to another embodiment of this invention in an unassembled condition;

FIG. 14B illustrates the single crystal growing component of FIG. 14A in an assembled condition in which a retaining pin retains the portions together;

FIG. 15 illustrates a single crystal growing component according to another embodiment of this invention including a retaining pin which retains the portions in a side-by-side arrangement;

FIG. 16 illustrates a single crystal growing component according to another embodiment of this invention including a heat conducting pin attached to a seed crystal;

DETAILED DESCRIPTION OF PREFERRED EMBODIMENTS

This invention is directed to a Czochralski crystal growing system which includes components for adding to, or placing in, semiconductor materials. The components can be used for doping semiconductor materials. The components can also be used for growing improved single crystals with or without dopants.

This invention also provides methods of adding dopants to semiconductor materials.

This invention further provides methods of pre-heating a seed crystal before it is dipped into a melt, and growing improved single crystals using the pre-heated seed crystal.

Figure 1:
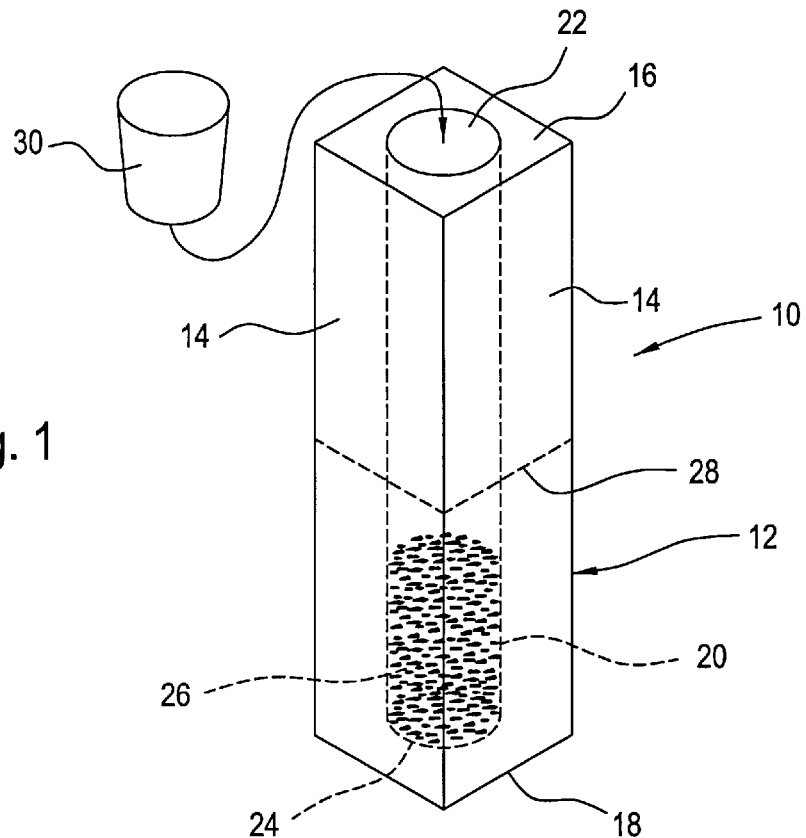
FIG. 1 is a perspective view of a dopant delivery component of a Czochralski crystal growing system including a cavity containing a dopant, an opening at a top face of the body portion and a closure for closing the opening according to an embodiment of this invention.

FIG. 1 illustrates an embodiment of a dopant delivery component 10 of the Czochralski single crystal growing system of this invention. The dopant delivery component 10 is used for adding dopant materials to semiconductor materials. The dopant delivery component 10 comprises a rectangular body portion 12 including side faces 14, a top face 16 and a bottom face 18 forming an outer surface. The body portion 12 can alternately have other shapes, such as prismatic or cylindrical. A cavity 20 (or void) is formed in the body portion 12 and includes an open end 22 at the top face 16 and a closed end 24 opposite the open end 22. The cavity 20 extends downwardly from the top face 16 toward the bottom face 18.

The cavity 20 is sized to contain a desired amount of a dopant 26 entirely inside the body portion 12. The desired amount of the dopant is an effective amount to add to a semiconductor material to achieve desired electrical properties in the semiconductor material. When the dopant is added to a melt, the amount of dopant that is added achieves a concentration of the dopant that relates to the desired electrical properties. The dopant 26 is shown positioned in a space at the closed end 24 of the cavity 20. The body portion 12 functions as a container for the dopant 26 and also as a vehicle for adding the desired amount of the dopant 26 directly to a semiconductor material.

According to an aspect of this invention, the body portion 12 is preferably composed of the semiconductor material to which the dopant 26 is added. The latter semiconductor material can be a melt contained in a crucible of a conventional crystal growing furnace, such as disclosed in U.S. Pat. No. 5,406,905, which is incorporated herein by reference. To add the dopant 26 into the melt, at least a part of the body portion 12 (the dip portion) is dipped into the melt to melt the dip portion and release the dopant into the melt to form a mixture with the molten semiconductor material. For the dopant delivery component 10, the body portion 12 is preferably dipped to about the melt dip line 28 to release the dopant 26. The portion of the body portion between the melt dip line 28 and the top face 16 can remain unmelted during doping. The entire body portion can alternately be dropped into the melt.

Alternately, the body portion 12 can be composed of other materials that are chemically compatible with the semiconductor material to which the dopant 26 is added. For example, the body portion 12 can be composed of quartz, silicon carbide and the like.

Figure 2:
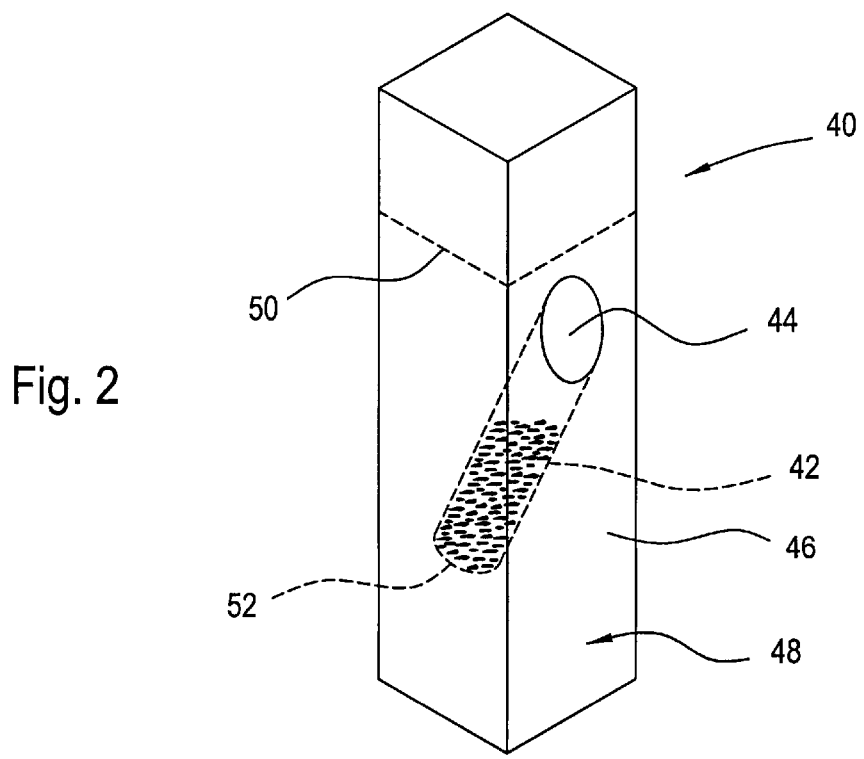
FIG. 2 is a perspective view of a dopant delivery component including a cavity opening at a side face of the body portion according to another embodiment of this invention.

According to another aspect of this invention, the body portion 12 can be composed be a seed crystal for growing a single crystal from the semiconductor material melt. For example, the body portion 12 can be composed of monocrystalline silicon, gallium arsenide, indium phosphide and other semiconductor materials. In such embodiments, the dip portion is dipped into the melt and melted so that the dopant 26 is released into the melt. The remaining unmelted portion of the body portion 12 is then withdrawn to pull a single crystal from the melt. For example, in the embodiment of the dopant delivery component 40 shown in FIG. 2, the cavity 42 includes an open end 44 at the side face 46 of the body portion 48. When the body portion 48 is a seed crystal, the dip portion below the melt dip line 50 can be dipped into the melt to release the dopant 52 contained in the cavity 42, and the remainder of the body portion 48 above the melt dip line 50 can be withdrawn from the melt to pull a single crystal.

The dopant delivery components 10, 40 including the contained dopant can alternately be added to solid semiconductor material in a clean environment such as a clean room. For example, the semiconductor material can be solid polycrystalline silicon stored in a clean environment to prevent contamination. After the dopant delivery component is added to the semiconductor material, the semiconductor material and the dopant delivery component are placed in a crucible of a crystal growing furnace and melted to a liquid state to form a melt including the desired amount of dopant.

As shown in FIG. 1, the dopant delivery component 10 can comprise a closure 30 to close the open end 22 of the cavity 20 to prevent contaminants from entering the cavity and contaminating the dopant 26. This feature is especially advantageous when the melt must have a very high purity level to produce high-purity single crystals. The closure 30 also protects the dopant 26 in the cavity 20 from exposure to heat which can cause premature evaporation of dopants having a high vapor pressure, such as antimony. The dopants are also protected from gas flows such as inert gas flows in the crystal growing furnace. Accordingly, the dopant is not disturbed by such gas flows.

The closure 30 can be any suitable member that closes the open end 22 of the cavity 20. For example, the closure 30 can be configured to be inserted into the cavity 20 at the open end 22 as depicted by the arrow. The closure 30 preferably forms a seal with the wall of the body portion 12 defining the cavity 20 so as to protect the dopant 26 from contamination and gas flows. Alternately, the closure 30 can be a cap or the like that is configured to fit on the outside or other appropriate part of the body portion 12 and close the open end 22 of the cavity 20.

The closure 30 can be composed of the semiconductor material so that it can be added into the melt along with the dopant 26. In embodiments of the dopant delivery component in which the closure 30 is not immersed in the melt during the addition of the dopant, the closure 30 can alternately be formed of other materials that are chemically compatible with the melt. For example, the closure 30 can be formed of silicon, quartz, silicon carbide or the like. Such closures can typically be reused. Also, the closure 30 and the dopant 26 can be formed of an integral or monolithic piece (not shown).

The size of the cavity 20 can be varied depending on the desired dopant capacity of the dopant delivery component 10. Typically, the cavity 20 is cylindrical shaped as shown and has a diameter which is sufficiently large to enable the dopant 26 to be placed at the closed end of the cavity. By positioning the dopant 26 at the closed end 24 of the cavity 20 in the dopant delivery component 10, the dip portion of the body portion dipped into the melt to release the dopant 26 is decreased in length. This feature can reduce the time required to add the dopant 26 to the melt and to perform the crystal growing process.

For the embodiment shown in FIG. 1, the body portion 12 can be dipped in a melt to a position such as indicated by the melt dip line 28 to release the dopant 26. The body portion 12 can then be withdrawn from the melt and removed from the pull chamber of the crystal growing furnace. The cavity in the resulting body portion would have an open bottom end (not shown) opposite to the open end 22 at the top face 16. The body portion having such opposed open ends can be reused by closing the open bottom end using a closure as described above so that dopant can be contained in the cavity. The body portion can then be reused to dope a melt so long as the cavity has sufficient volume to contain the desired amount of dopant.

Furthermore, the cavity can be open at opposed ends as described above. In such embodiments, one of the open ends is typically closed by a closure to contain the dopant in the cavity. Both open ends can be closed by closures in instances in which the dopant needs to be further protected from potential contamination or gas flows in the crystal growing furnace.

Figure 3:
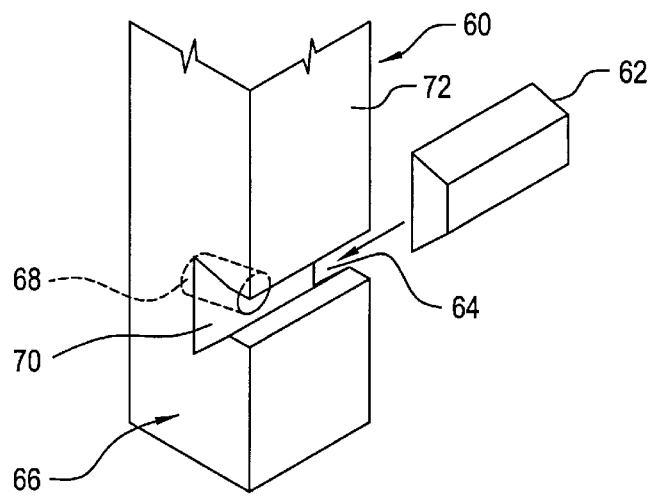
FIG. 3 is a perspective view of a dopant delivery component including a wedge-shaped closure for the open end of a horizontal cavity according to another embodiment of this invention.

According to another aspect of this invention, the closure for the one or more open ends of the cavity can have various configurations. The closures can be fitted in like-shaped openings in the body portion of the dopant delivery component to close the open ends of cavities. Exemplary closure configurations are shown in FIGS. 3–7B. In the dopant delivery components 60, 80 shown in FIGS. 3 and 4, respectively, the closures 62, 82 respectively, are wedge shaped to fit into wedge shaped openings 64, 84 respectively, formed in the body portions 66, 86. In FIG. 3, the cavity 68 is horizontal and the opening 70 opens toward a side face 72 of the body portion 66. Due to the horizontal orientation of the cavity 68, the closure 62 may not need to be used to close the open end 70 of the cavity for the purpose of preventing dopants from coming out of the cavity 68. The closure 62 is preferably used in applications of the dopant delivery component 60 in which the dopant needs to be further protected from contamination and/or gas flows.

Figure 4:
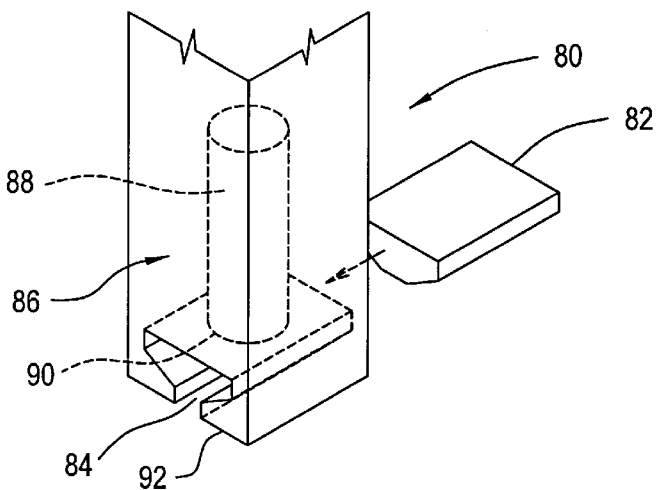
FIG. 4 is a perspective view a dopant delivery component including a wedge-shaped closure for the open end of a downward opening vertical cavity according to another embodiment of this invention.

In FIG. 4, the cavity 88 is vertical and includes an open end 90 facing the bottom face 92 of the body portion 86. The closure 82 in this embodiment maintains the dopant in the cavity 88.

Figure 5:
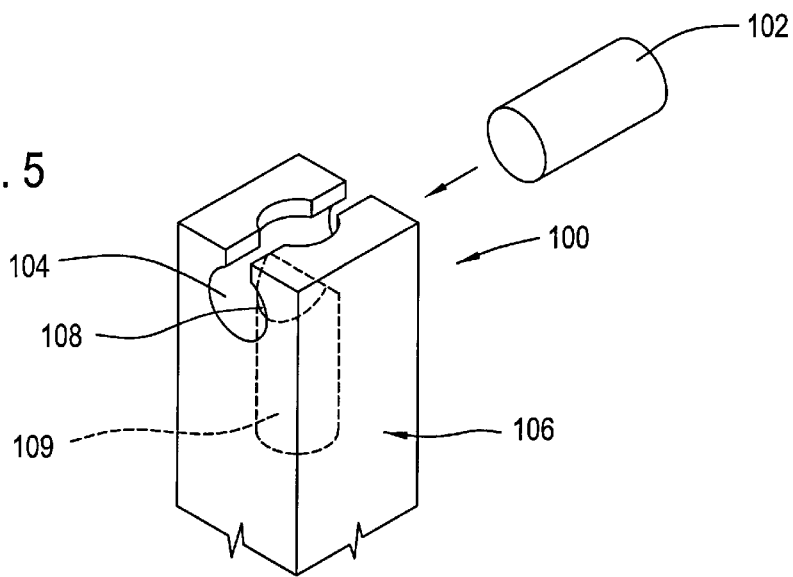
FIG. 5 is a perspective view a dopant delivery component including a cylindrical-shaped closure for closing the open end of a vertical cavity at the top face of a body portion according to another embodiment of this invention.

Referring to FIG. 5, the dopant delivery component 100 can include a closure 102 and an opening 104 in the body portion 106 that are cylindrical shaped. The closure 102 is inserted in the opening 104 to close an open end 108 of a vertical cavity 109. The cavity 109 can be formed at the top end of the body portion 106 as shown, or alternately at the bottom end (not shown).

As shown in FIG. 6, the dopant delivery component 110 can include a body portion 112 defining two cavity portions 114, 114'. The cavity portion 114' extends upwardly from the bottom face 116 to the opening 118 for receiving the closure 120 and including two opposed open ends. The cavity portion 114 extends upwardly from the opening 118 and including a closed upper end 122. The closure 120 can close the adjacent open ends of both of the cavity portions 114, 114' when inserted into the opening 118. An additional closure (not shown) can be used to close the second open end 119 of the cavity portion 114. The same or different dopants can be placed in the two cavity portions 114, 114'.

FIG. 7A shows a dopant delivery component 130 including a closure 132 having a plate-shaped configuration according to another embodiment of this invention. The closure 132 is inserted into an opening 134 to close the open end 136 of the cavity 138 disposed near the bottom end of the body portion 140.

FIG. 7B illustrates an embodiment 130' in which a plate shaped closure 132' is inserted into an opening 134' near the top end of a body portion 140'.

Referring to FIG. 8, a dopant delivery component 150 according to this invention can comprise separate portions; namely, a lower portion 152 and a body portion 154 engaged with the lower portion 152. The lower portion 152 includes a cavity 156 sized to contain a desired amount of dopant 158 for adding to a melt. The cavity 156 typically includes a closed end 160 and an opposed open end 162. The open end 162 is formed at an upper face 164 of the lower portion 152 in FIG. 8.

The lower portion 152 is preferably composed of the same material as the melt. For example, the lower portion 152 can be composed of silicon. Alternately, the lower portion 152 of this or any of the embodiments can be composed of a material different from but chemically compatible with the material of the melt. The lower portion 152 is composed of a material having a sufficiently high melting temperature to remain attached to the body portion 154 when the lower portion 152 is lowered and dipped into the melt, so that the dopant can be released directly into the melt.

The lower portion 152 further includes an engagement portion 166 that engages a like-shaped element, typically a hole, formed in the body portion 154. The open end 162 of the cavity 156 is closed by an opposing surface of the body portion 154 which defines in part the opening in the body portion. This opposing surface maintains the dopant 158 in the cavity 156 and also prevents contaminants and gas flows from entering the cavity 156.

During use of the dopant delivery component 150, the body portion 154 is attached to a chuck (not shown) that securely holds the dopant delivery component during the doping process. The chuck is connected to a cable (not shown) that moves the dopant delivery component 150 relative to a melt of a semiconductor material. The dopant delivery component 150 is lowered so that the lower portion 152 is dipped into the melt to melt the lower portion 152 so as to release the dopant 158 into the melt. As described below, the lower portion 152 is dipped entirely into the melt or only partially into the melt, depending on the composition and function of the body portion 154.

More particularly, the body portion 154 can function as a carrier for the lower portion 152. Alternately, the body portion 154 can function as both a carrier for the lower portion 152 and also a seed crystal for growing a single crystal from a melt of a semiconductor material that has been doped by the release of the dopant 158 from the lower portion 152. In embodiments in which the body portion 154 is a carrier only, the body portion 154 is typically not dipped into the melt during doping. In such embodiments, the body portion 154 can be composed of any suitable material that is chemically compatible with the melt. For example, the body portion 154 can be composed of quartz, silicon carbide or other like materials. The body portion 154 can be reused after the lower portion 152 is dipped into the melt to add the dopant 158.

In embodiments in which the body portion 154 functions as both a carrier for the lower portion 152 and also a seed crystal for growing a single crystal from a melt of a semiconductor material, the body portion 154 is composed of the same material as that of the semiconductor material melt into which the dopant 158 is added. For example, the body portion 154 can be composed of single crystal silicon, gallium arsenide, indium phosphide and other semiconductor materials from which single crystals are grown. In order to use the dopant delivery component 150, the lower portion 152 and a portion of the body portion 154 below the melt dip line 168 are dipped into a melt. The lower portion 152 is completely melted so as to release the dopant 158 into the melt. The body portion 154 below the melt dip line 168 may be melted. The body portion 154 is then withdrawn from contact with the melt to grow a single crystal.

According to another aspect of this invention, the lower portion 152 can function as a heat sink to prevent the seed crystal (body portion 154) from contacting the melt until the seed crystal has been preheated by heat transfer from the melt, through the lower portion 152 and into the seed crystal. As a result of this preheating, the temperature gradient between the melt and the seed crystal is decreased, causing the seed crystal to be heated more slowly by the melt than in known processes in which the seed crystal is dipped directly into the melt without the provision of the lower portion 152 to act as a heat sink.

As described in greater detail below, preheating of the seed crystal is advantageous to reduce the generation of dislocations in the seed crystal. Consequently, the quality of single crystals produced using the dopant delivery component can be increased while also reducing scrap.

The lower portion of the dopant delivery component can have various configurations. As shown in FIG. 8, the engagement element 166 can be wedge-shaped.

Alternately, the lower portion 170 shown in FIG. 9 comprises an engagement element 172 which includes a plate shaped region 174 and a neck 176 that interlock with a like-shaped opening in the body portion (FIG. 10).

FIGS. 8 and 9 illustrate generally cylindrical shaped cavities 158, 178, respectively.

In the dopant delivery component 180 shown in FIG. 10, the cavity 182 in the lower portion 184 is rectangular shaped.

Referring to FIG. 11, the lower portion 192 of the dopant delivery component 190 can include a thin neck region 194 and an engagement element 196 for engaging the body portion 198. This neck configuration 194 reduces heat transfer from the lower portion 192 to the body portion 198, and thus reduces the temperature gradient between the melt and the body portion 198. In addition, the neck region 194 is readily melted by the melt.

The Czochralski crystal growing system of this invention also provides single crystal growing components for growing bulk single crystals having reduced dislocation densities. FIGS. 12–18 illustrate various embodiments of a single crystal growing component according to another aspect of this invention.

FIG. 12 illustrates a single crystal growing component 210 including an upper portion which is a seed crystal 212 and a lower portion 214. According to this and other embodiments described below, the lower portion 214 of the single crystal growing component 210 may optionally not contain a dopant. Accordingly, in such embodiments, the single crystal growing component may optionally not be used to dope a melt of semiconductor material. Rather, the lower portion in such embodiments functions as a heat sink to transfer heat from the melt to the seed crystal, so as to pre-heat the seed crystal before it is dipped into the melt. As described in greater detail below, the single crystal growing components can be used to grow improved single crystals with reduced dislocation densities.

In the single crystal growing component 210, the seed crystal 212 includes a bottom surface 216, and the lower portion 214 is secured to the seed crystal 212 such that the lower portion 214 extends partially below the bottom surface 216. The seed crystal 212 includes opposed depressions 218 which mate with protuberances 220 of the lower portion 214 to retain the seed crystal 212 and the lower portion 214 together during use of the single crystal growing component 210 for single crystal growing.

During use, the lower portion 214 is dipped completely into the melt such that the seed crystal 212 is also dipped into the melt up to about the dip line 222. The lower portion 214 causes the seed crystal 212 to be preheated by heat transferred from the melt, so that when the seed crystal 212 contacts the melt it is at a higher temperature than it would be if alternately dipped directly into the melt without the provision of the lower portion 214. Preheating the seed crystal 212 reduces the temperature differential between the seed crystal 212 and the melt and thus can reduce the likelihood and severity of thermal shock caused by this temperature difference. Consequently, the generation of dislocations, at the interface that forms between the seed crystal 212 and single crystals pulled from the melt, due to thermal shock and thermal strains can be reduced.

The rate of preheating of the seed crystal 212 can be affected by varying different aspects of the lower portion 214. For example, by changing the mass of the lower portion 214, the rate of heat transfer to the seed crystal can be varied. The mass can be varied by changing the size of the lower portion 214. Increasing the size and mass of the lower portion 214 can decrease the rate of preheating of the seed crystal 212.

One or more voids 224 can be formed in the lower portion 214 to reduce the mass of the lower portion 214 to control heat transfer to the seed crystal 212.

The rate of heat transfer to the seed crystal 212 can also be controlled by varying the contact area between the seed crystal 212 and the lower portion 214. For example, in the single crystal growing component 210 shown in FIG. 12, contact occurs between the surfaces 226 and 216 of the seed crystal 212, and the surfaces 228 and 230, respectively, of the lower portion 214.

FIG. 13 illustrates a single crystal growing component 240 including a seed crystal 242 and a lower portion 244 which acts as a heat sink. Contact between the seed crystal 242 and the lower portion 244 occurs at regions 246. The area of the regions 246 is reduced as compared to the contact area of the single crystal growing component 210 in FIG. 12. Accordingly, the single crystal growing component 240 can reduce heat transfer to the seed crystal 242 by conduction as compared to the single crystal growing component 210. The dip line 248 of the seed crystal 242 is shown.

It is also possible to vary the contact area between the lower portion and the seed crystal of the single crystal growing components by varying the tightness of the engagement between the lower portion and the seed crystal. Increasing the tightness of the fit increases the contact area and enhances heat conduction to the seed crystal, while less tight fits reduce heat conduction. For example, in the single crystal growing component 210, making the fit less tight reduces contact between the surfaces 216, 226 and 230, 228, respectively.

The rate of pre-heating of the seed crystal of the single crystal growing component can also be controlled by varying the composition of the lower portion to vary its thermal conductivity. The lower portion is composed of a material that is chemically compatible with the melt. This material can be selected to provide a desired thermal conductivity for the lower portion, so as to control heat transfer from the melt to the seed crystal. For example, the material can be heavily doped silicon. The material has a sufficiently high melting temperature so that the lower portion remains attached to the seed crystal for at least a portion of the time period over which the lower portion is lowered and dipped into the melt. Preferably, the lower portion remains attached to the seed crystal over the entire dipping process until the lower portion is substantially completely melted.

In addition, the rate of pre-heating of the seed crystal of the single crystal growing component can be controlled by varying the rate at which the lower portion is dipped into the melt. For example, the dip rate can be reduced to reduce the temperature gradient between the melt and the seed crystal to reduce thermal shock.

FIGS. 14A and 14B illustrate a single crystal growing component 250 including a seed crystal 252 and a lower portion 254 which functions as a heat sink. As shown in FIG. 14B, the seed crystal 252 and the lower portion 254 can be retained together by a retaining pin 256 which is inserted through aligned holes 258 and 260 formed in the lower portion 254 and the seed crystal 252, respectively. The retaining pin 256 can be formed of any suitable material that does not chemically contaminate the semiconductor material.

FIG. 15 illustrates a single crystal growing component 270 including a seed crystal 272, a lower portion 274 that functions as a heat sink, and a retaining pin 276. As shown, the retaining pin 276 can retain the seed crystal 272 and lower portion 274 together in a side-by-side arrangement. The seed crystal 272 can be laterally spaced from the lower portion 274 by a gap 278, such that heat conduction between the lower portion 274 and the seed crystal 272 occurs primarily via the retaining pin 276. The gap 278 and the mass and thermal conductivity of the retaining pin 276 can be varied to affect the rate of heat transfer to the seed crystal 272 and, thus, the rate of preheating.

FIG. 16 illustrates a single crystal growing component 280 including a seed crystal 282 and a heat conducting pin 284 which extends through the seed crystal 282. The heat conducting pin 284 is dipped into a melt to conduct heat to the seed crystal 282. The distance 285 between the bottom surface 286 of the seed crystal 282 and the lower (dip) end 288 of the heat conducting pin 284 can be varied to vary the amount of time heat is conducted from the melt to the seed crystal 282 until the bottom surface 286 contacts the melt, at a given dip rate of the heat conducting pin 284, to vary the amount of preheating of the seed crystal 282. The dip line 290 of the seed crystal 282 is shown.

Figure 17:
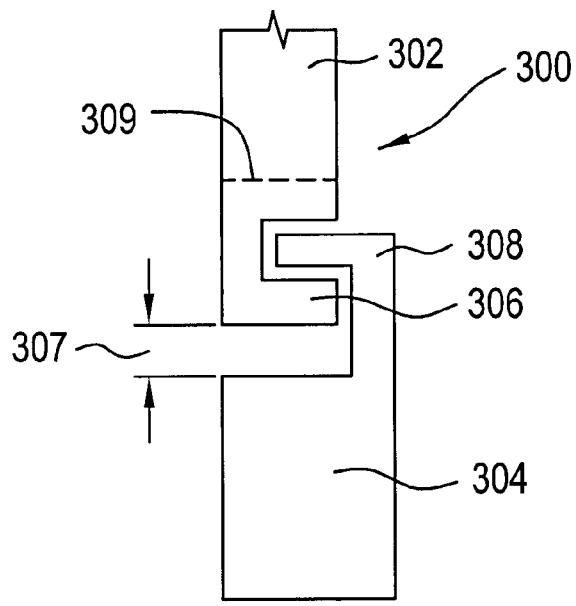
FIG. 17 illustrates a single crystal growing component according to another embodiment of this invention.

FIG. 17 illustrates a single crystal growing component 300 according to another embodiment of this invention, including a seed crystal 302 and a lower portion 304 which functions as a heat sink during single crystal growing. The seed crystal 302 and the lower portion 304 include respective engagement portions 306, 308. The tightness of the fit between the engagement portions 306, 308 can be varied to vary the contact area between the seed crystal 302 and the lower portion 304. For example, there can be a gap 307 to reduce the contact area. The dip line 309 of the seed crystal 302 is shown.

Figure 18:
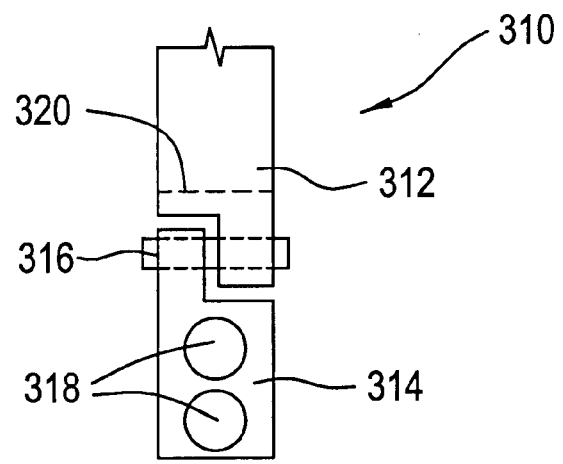
FIG. 18 illustrates a single crystal growing component according to another embodiment of this invention including a retaining pin and the lower portion including voids.

FIG. 18 illustrates a single crystal growing component 310 according to another embodiment of this invention, including a seed crystal 312, a lower portion 314 that function as a heat sink during single crystal growing, and a retaining pin 316 which retains the seed crystal 312 and the lower portion 314 together. The seed crystal 312 and the lower portion 314 can be spaced from each other such that heat is conducted to the seed crystal 312 primarily through the retaining pin 316. As shown, the lower portion 314 can include one or more voids 318 to further affect heat transfer to the seed crystal 312. The dip line 320 of the seed crystal 312 is shown.

The single crystal growing component of the Czochralski crystal growing system of this invention can preheat the seed crystal in a controlled manner such that dislocations that are caused by thermal shock of the seed crystal by contact with the melt can be at least reduced or possibly even eliminated. Consequently, it may be possible to grow single crystals using the Czochralski crystal growing system without forming a neck region in the single crystal to reduce dislocations.

While this invention has been described in conjunction with the specific embodiments described above, it is evident that many alternatives, combinations, modifications and variations are apparent to those skilled in the art. Accordingly, the preferred embodiments of this invention as set forth above are intended to illustrative and not limiting. Various changes can be made without departing from the spirit and scope of this invention.

What is claimed is:

1. A component of a Czochralski crystal growing system for contacting a molten semiconductor material, comprising:
   a portion composed of a material that is chemically compatible with the semiconductor material;
   a cavity in the portion; and
   a closure for closing the cavity and thereby, with the portion, defining a space for holding an entire effective amount of a dopant to add to the semiconductor material out of contact with an ambient atmosphere surrounding the cavity, and the dopant being separate from the closure.

2. The component of claim 1, wherein the portion comprises a seed crystal of the semiconductor material.

3. The component of claim 1, further comprising the entire desired amount of the dopant disposed in the space.

4. The component of claim 3, wherein the cavity includes at least one open end, and the closure is sized to be inserted into the cavity at the at least one open end so as to define the space.

5. The component of claim 1, wherein the portion comprises an outer surface, and the cavity includes a pair of opposed open ends at the outer surface.

6. A component of a Czochralski crystal growing system for contacting a molten semiconductor material, comprising:
   a portion composed of material that is chemically compatible with the semiconductor material; and
   a cavity in the portion;
   an effective amount of a dopant to add to the semiconductor material disposed entirely inside the cavity;
   wherein the dopant is protected in the cavity from contact with an ambient atmosphere in a crystal growing furnace.

7. The component of claim 6, wherein the portion comprises an outer surface, and the cavity includes only a single open end at the outer surface.

8. A method of forming a component of a Czochralski crystal growing system for contacting a molten semiconductor material, comprising:
   forming a portion composed of a material that is chemically compatible with the semiconductor material, the portion including a cavity; and placing an effective amount of a dopant to add to the semiconductor material entirely inside the cavity such that the dopant is protected from contact with an ambient atmosphere in a crystal growing furnace.

9. A component of a Czochralski crystal growing system for adding to a molten semiconductor material, comprising:

a first portion composed of a material that is chemically compatible with the semiconductor material;

a second portion engaged with the first portion, the second portion being composed of a material that is chemically compatible with the semiconductor material; and a cavity in at least one of the first portion and the second portion, the cavity being sized to contain a desired amount of the dopant entirely within the cavity.

10. The component of claim 9, wherein the cavity is disposed in the first portion.

11. The component of claim 9, wherein the second portion is a seed crystal of the semiconductor material, and the cavity is disposed in the first portion.

12. The component of claim 9, wherein the first portion and the second portion include mating engagement elements.

13. The component of claim 9, wherein the cavity is disposed in the second portion, and the first portion comprises an outer surface which closes an open end of the cavity to prevent contamination of the dopant in the cavity.

14. A method of adding a dopant to a semiconductor material in a container, comprising:

providing a component of a Czochralski crystal growing system, including:
  a first portion composed of a material that is chemically compatible with the semiconductor material; and
  a cavity in the first portion;

placing a desired amount of the dopant entirely into the cavity of the first portion; and adding the component to the semiconductor material in the container.

15. The method of claim 14, wherein the first portion is composed of the semiconductor material.

16. The method of claim 15, further comprising providing a second portion engaged with the first portion, the second portion being composed of the semiconductor material.

17. The method of claim 14, wherein the cavity includes at least one open end, and further comprising closing the at least one open end after placing the dopant into the cavity.

18. The method of claim 17, wherein closing comprises inserting a closure into the cavity at the at least one open end, the closure being composed of a material that is chemically compatible with the semiconductor material.

19. The method of claim 14, wherein the semiconductor material in the container is a melt, and the adding comprises dipping the first portion of the component into the melt so as to release the desired amount of the dopant directly into the melt.

20. The method of claim 14, further comprising providing a second portion engaged with the first portion, the second portion being composed of a material that is chemically compatible with the semiconductor material.

21. The method of claim 20, wherein the second portion comprises an outer surface which closes the at least one open end of the cavity.

22. The method of claim 20, wherein the second portion is a seed crystal of the semiconductor material.

23. The method of claim 22, wherein the semiconductor material in the container is a melt, and the adding comprises dipping the entire first portion and only a dip portion of the seed crystal into the melt so as to release the desired amount of the dopant into the melt and to melt the dip portion of the seed crystal.

24. The method of claim 23, wherein the first portion conducts heat from the melt to the seed crystal so as to pre-heat the seed crystal, when the first portion is dipped into the melt of the semiconductor material.

25. The method of claim 20, wherein the semiconductor material in the container is a melt, and the adding comprises dipping only the first portion of the component in the melt so as to release the desired amount of the dopant directly into the melt.

26. The method of claim 14, wherein the semiconductor material in the container is a solid.

27. A component of a Czochralski single crystal growing system for placing into a melt of a semiconductor material, comprising:

a first portion composed of a material that is chemically compatible with the semiconductor material and having a first surface;

a second portion engaged with the first portion, the second portion having a second surface facing the first surface and the first portion extending away from the second surface, the second portion being a seed crystal composed of the semiconductor material; and wherein when the first portion is placed into the melt of the semiconductor material, the first portion conducts heat from the melt to the second portion such that the second portion is pre-heated before being placed into the semiconductor material.

28. The component of claim 27, wherein the first portion has a sufficient melting temperature such that the first portion remains engaged with the second portion when the first portion is placed into the melt of the semiconductor material.

29. The component of claim 27, wherein at least one of the first portion and the second portion comprises a cavity sized to contain an effective amount of a dopant to add to the melt of semiconductor material entirely within the cavity.

30. A method of placing a component of a Czochralski crystal growing system into a melt of a semiconductor material, comprising:

providing a first portion composed of a material that is chemically compatible with the semiconductor material;

securing a second portion to the first portion, the second portion being a seed crystal composed of the semiconductor material;

placing the first portion into the melt of the semiconductor material such that the first portion (i) remains secured to the second portion, and (ii) conducts heat from the melt to the second portion so as to pre-heat the second portion before the second portion is placed into the melt.

31. The method of claim 30, wherein at least one of the first portion and the second portion includes a cavity containing an effective amount of a dopant to add to the melt entirely within the cavity, and placing further comprises releasing the dopant into the melt.

32. The method of claim 30, wherein the first portion is placed into the melt such that the second portion is preheated during dipping such that (i) a temperature differential between the melt and the second portion is reduced, and (ii) dislocation generation at an interface between the second portion and a single crystal formed from the melt is reduced.

33. The method of claim 30, further comprising controlling the rate of placing the first portion into the melt so as to control the rate at which the second portion is preheated.

34. The method of claim 30, further comprising varying at least one of (i) the mass of the first portion, (ii) a coefficient of thermal conductivity of the first portion, and (iii) a surface contact area between the first portion and the second portion, so as to control the rate at which the second portion is pre-heated by heat transfer from the melt.

* * * * *